(12) United States Patent
Choi et al.

(10) Patent No.: US 6,411,086 B1
(45) Date of Patent: Jun. 25, 2002

(54) DIFFERENTIAL SOLENOIDAL MAGNETIC FIELD SENSING DEVICE AND METHOD FOR MANUFACTURING THE SAME

(75) Inventors: Sang-on Choi; Han-ki Cho, both of Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/348,047

(22) Filed: Jul. 6, 1999

(30) Foreign Application Priority Data

Jul. 7, 1998 (KR) .............................................. 98-27304

(51) Int. Cl.$^7$ .............................................. G01R 33/04
(52) U.S. Cl. ........................ 324/253; 324/252; 324/249; 336/200
(58) Field of Search ................................ 29/595–592.1, 29/602.1; 324/249, 200, 253–255, 260, 244, 252; 33/361; 340/870.33; 336/212, 221, 226, 200

(56) References Cited

U.S. PATENT DOCUMENTS 5,450,263 A * 9/1995 Desaigoudar et al. ....... 360/110

FOREIGN PATENT DOCUMENTS

JP 8-179023 * 7/1996

* cited by examiner

*Primary Examiner*—Jay Patidar
(74) *Attorney, Agent, or Firm*—Burns, Doane, Swecker & Mathis, L.L.P.

(57) ABSTRACT

A differential solenoidal magnetic field sensing device is a magnetic field sensor fabricated on a microscopic scale and is constructed by two soft magnetic film cores laminated on a semiconductor substrate, an excitation of the soft magnetic film cores, and a magnetic flux variation detecting coil formed of a spirally wound metal film pattern. Since two soft magnetic film cores constitutes closed magnetic paths, leakage of magnetic flux can be minimized. Also, the magnetic sensing device is a differential type sensor, the combination of driving signals can be offset. That is to say, the magnetic field sensing device is constructed such that two soft magnetic film cores are laminated and are formed lengthwise in the direction of a detection axis to reduce anti-magnetic field components, and the excitation coil wound around the two soft magnetic film cores and the magnetic flux variation detecting coil for obtaining the sum of magnetic flux variations generated in the soft magnetic film cores are alternately wound turn by turn around the soft magnetic film cores.

16 Claims, 6 Drawing Sheets

DIFFERENTIAL SOLENOIDAL MAGNETIC FIELD SENSING DEVICE AND METHOD FOR MANUFACTURING THE SAME

This application claims priority under 35 U.S.C. §§119 and/or 356 to 98-27304 filed in Korea on Jul. 7, 1998; the entire content of which is hereby incorporated by reference.

BACKGROUND OF THE INVENTION

1. Field of the Invention

The present invention relates to a differential solenoidal magnetic field sensing device having microscopic closed magnetic paths integrated on a semiconductor substrate and a manufacturing method thereof, and more particularly, to a differential solenoidal magnetic field sensing device which is integrated on a semiconductor substrate, for detecting a magnetic field weaker than a terrestrial magnetic field by forming closed magnetic paths by differentially driving two soft magnetic film cores, and a manufacturing method thereof.

2. Description of the Related Art

A magnetic sensor using a soft magnetic material and a coil has long been used as a magnetic sensor with high sensitivity. Such a magnetic sensor is manufactured by winding a coil around a relatively large rod-shaped core or an annular core made of soft magnetic ribbon. In order to accurately detect a magnetic field, an electromagnetic circuit is necessary. A method in which a magnetic field sensing element of the magnetic sensor is attained by a soft magnetic film core and a planar film coil has been proposed.

A conventional weak magnetic field sensing device is manufactured using soft magnetic film cores 1a and 1b and a planar film coil. These two cores 1a and 1b are arranged in parallel in the direction of a detection axis to then be differentially driven. This is for offsetting an induced voltage based on electromagnetic induction when no external magnetic field is applied such that an excitation coil 2a–2b and a magnetic flux variation detecting coil 3a–3b are wound around two soft magnetic film cores 1a and 1b. Thus, the conventional weak magnetic field sensing device requires a large area. Also, due to a magnetic flux variation generated by the excitation coil 2a–2b and a magnetic field detected by the magnetic flux variation detecting coil 3a–3b, leakage of magnetic flux through the soft magnetic film cores. 1a and 1b cannot be avoided, which makes it difficult to detect a magnetic field with high sensitivity.

Since the conventional weak magnetic field sensing device is manufactured by winding a coil around a relatively large rod-shaped core or an annular core made of soft magnetic ribbon, the manufacturing cost thereof is high.

SUMMARY OF THE INVENTION

To solve the above problems, it is an objective of the present invention to provide a differential solenoidal magnetic field sensing device having microscopic magnetic paths integrated on a semiconductor substrate, which can accurately detect a high-sensitivity magnetic field by minimizing the leakage of magnetic flux and can be fabricated on a microscopic scale.

It is another objective of the present invention to provide a method for manufacturing a differential solenoidal magnetic field sensing device having microscopic magnetic paths integrated on a semiconductor substrate, which cn accurately detect a high-sensitivity magnetic field by minimizing the leakage of magnetic flux and can be fabricated on a microscopic scale.

Accordingly, to achieve the first objective, there is provided a differential solenoidal magnetic field sensing device including a semiconducor substrate, soft magnetic film cores stacked on the semiconductor substrate to be laminated to form closed magnetic paths parallel to each other, a solenoidal excitation coil formed of a metal thin film for alternative excitation and differential excitation of the soft magnetic film cores, and a solenoidal magnetic flux variation detecting coil made of a metal thin film for detection of magnetic flux variation in the soft magnetic film cores.

In the present invention, preferably, the excitation coil is wound n turns where n is a positive integer, and the magnetic flux variation detecting coil is wound m turns where m is a positive integer (m being different from n), the excitation coil and the magnetic flux variation detecting coil being alternately wound turn by turn. Also, when an external magnetic field is zero, the induced waveforms caused by the excitation coil are offset.

Also, it is preferred that the excitation coil is wound around the soft magnetic film cores, in a "figure-8" shape, and the magnetic flux variation detecting coil as a solenoidal planar coil is spirally wound around the soft magnetic film cores.

To achieve the second objective, there is provided a method for manufacturing a differential solenoidal magnetic field sensing device including the steps of (a) forming an insulation layer on a semiconductor substrate, (b) forming a bottom-layer wire in a coil on the insulation layer, (c) forming an insulation layer on the insulation layer of step (b) to cover the bottom-layer wire, (d) depositing a soft magnetic material for a bottom magnetic film on the insulation layer formed in step (c) and patterning the same to form a lower soft magnetic film core, (e) depositing an insulation layer to cover the lower soft magnetic film core and etching the same using photolithography to form a first throughhole, (f) forming a metal layer for a middle-layer wire on the insulation layer formed in step (e) and patterning the same to form a middle layer wire of a coil, (g) depositing an insulation layer on the insulation layer formed in step (e) to cover the middle-layer wire, depositing a soft magnetic material for a bottom magnetic film thereon and patterning the same to form an upper soft magnetic film core, (h) depositing an insulation layer to cover the upper soft magnetic film core and etching the same using Photolithography to form a second throughhole, and (i) forming a metal layer for a top-layer wire on the insulation layer formed in step (h) and patterning the same to form a top-layer wire of a coil.

In the present invention, it is preferred that the semiconductor substrate is a silicon substrate, and the bottom-layer wire, and the middle-layer wire and the top-layer wire are formed of at least one metal selected from the group consisting of aluminum (AI), gold (AU) and copper (CU). Also, when the bottom-layer wire, the middle-layer wire and the top-layer wire are formed of Al or Au, a deposition method such as a sputtering method or a CVD method is preferably used. Otherwise, when the bottom-layer wire, the middle-layer wire and the top-layer wire are formed of Cu, an electroplating method or a non-electrolytic plating method is used.

Further, the soft magnetic film cores are preferably formed of multi-layer soft magnetic films prepared by laminating a permalloy or amorphous magnetic alloy and a non-magnetic material, and the insulation layer is preferably formed of at least one of silicon oxide, photoresist or polyimide.

BRIEF DESCRIPTION OF THE DRAWINGS

The above objectives and advantages of the present invention will become more apparent by describing in detail a preferred embodiment thereof with reference to the attached drawings in which:

FIGS. 3A through 3F are timing diagrams illustrating the operation of the differential solenoidal magnetic field sensing device shown in FIG. 2, in which FIG. 3A is a waveform diagram of a magnetic field of a first soft magnetic film core, FIG. 3B is a waveform diagram of a magnetjic field of a second soft magnetic film core, FIG. 3C is a waveform diagram of the magnetic flux density of the first sole magnetic film core, FIG. 3D is a waveform diagram of a magnetic flux density of the second soft magnetic film core, FIGS. 3E and 3F are waveform diagrams of induced voltages, Vind1, Vind2 and Vind1+Vind2 in a magnetic flux variation detecting coil;

DESCRIPTION OF THE PREFERRED EMBODIMENT

Figure 1:
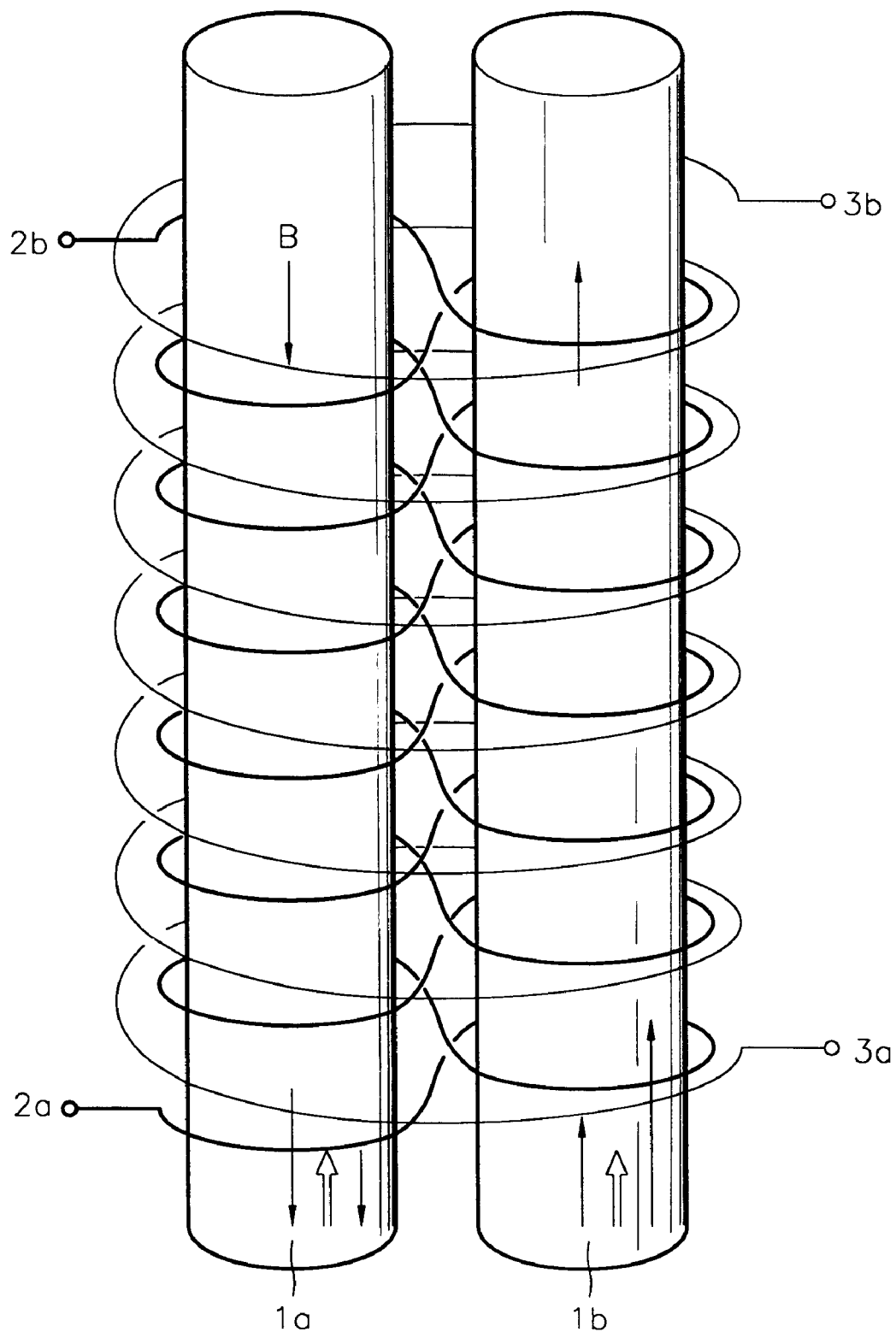
FIG. 1 is a schematic perspective view illustrating a conventional magnetic field sensing device.
Figure 2:
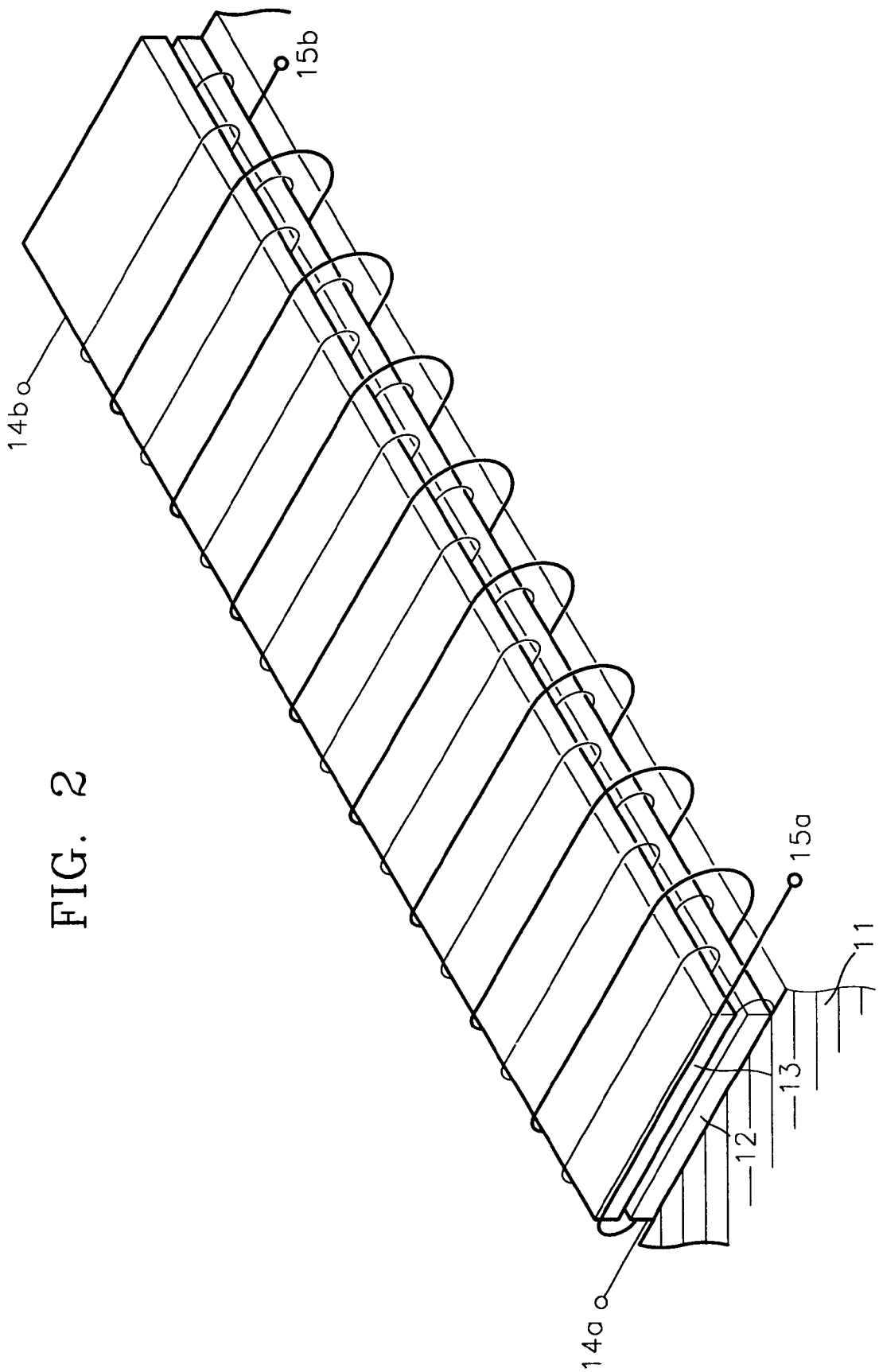
FIG. 2 is a schematic perspective view illustrating a differential solenoidal magnetic field sensing device integrated on a semiconductor substrate according to an embodiment of the present invention.
Figure 3:
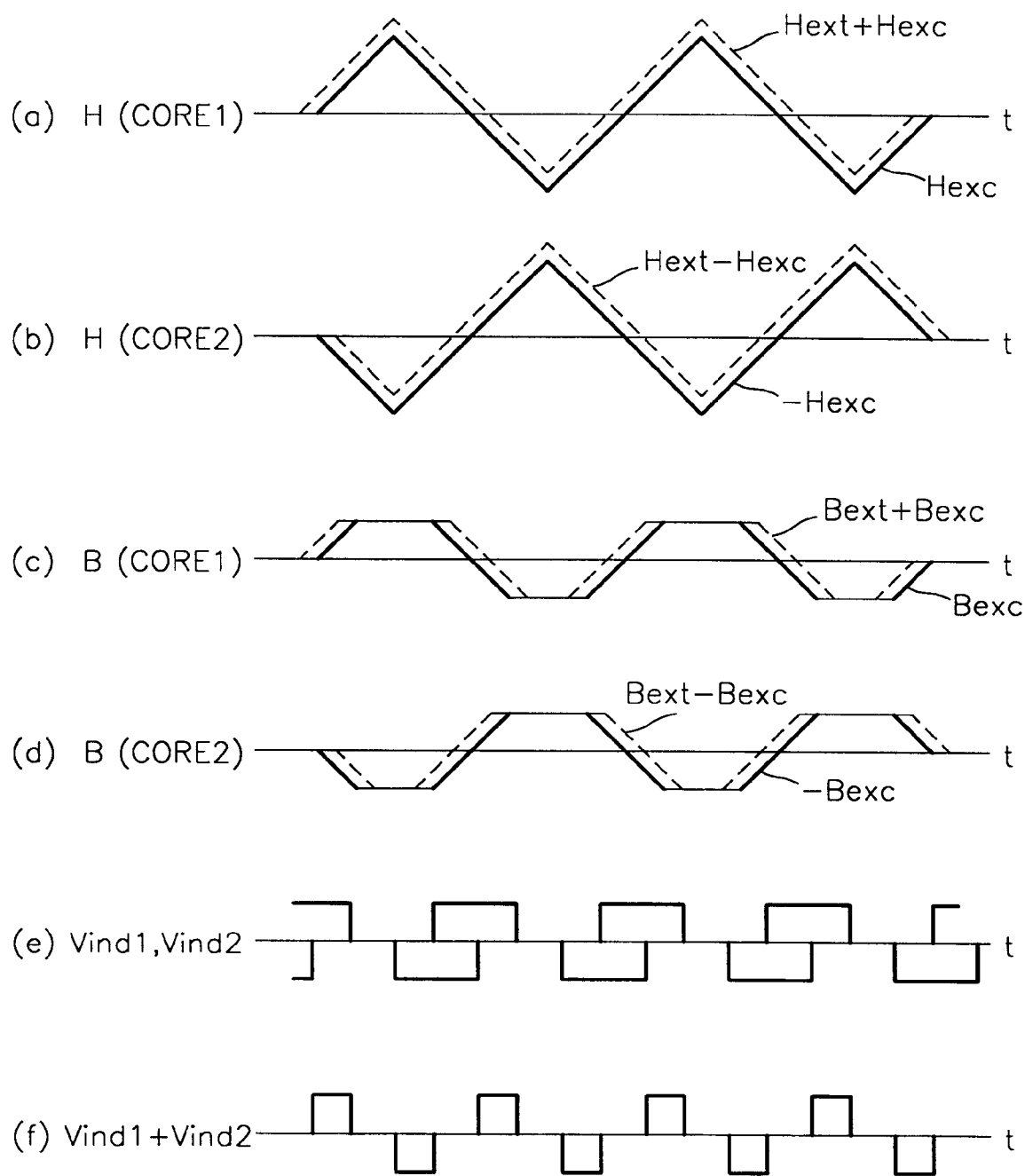

Referring to FIGS. 2 and 3A through 3F, the differential solenoidal magnetic field sending device according to the present invention is constructed such that two coils, that is, an excitation coil 14a–14b and a magnetic flux variation detecting coil 15a–15b, are wound around two soft magnetic film cores 12 and 13 sandwiched on a semiconductor substrate 11. Here, since the excitation coil 14a–14b is wound around the soft magnetic film cores 12 and 13 in a "figure-8" shape, as shown in FIG. 2, the magnetic fluxes of the upper and lower soft magnetic film cores 12 and 13 generated by alternating excitation currents, are opposite to each other. Also, since the magnetic flux variation detecting coil 15a–15b wound such that the sum of magnetic flux variations generated by the soft magnetic film cores 12 and 13 is detected thereby, the induced voltage of the magnetic flux variation detecting coil 15a–15b generated by the electromagnetic induction due to alternating excitation current are offset because the directions of the magnetic fields of the two soft magnetic film cores 12 and 13 are opposite to each other. An external magnetic field Hext is applied parallel to the axial directions of the soft magnetic film cores 12 and 13. That is to say, the external magnetic field Hext is applied in the same direction with respect to the soft magnetic film cores 12 and 13. Excitation currents which flow in an opposite direction to each other with respect to the soft magnetic film cores 12 and 13 because the excitation coil 14a–14b is wound in a "figure-8" shape with respect to the soft magnetic film cores 12 and 13. Thus, as shown in FIGS. 3A and 3B, excitation magnetic fields Hexc and -Hexc due to the excitation currents are generated to have opposite polarities. Therefore, the internal magnetic fields of the soft magnetic film cores 12 and 13 are Hext+Hexc and Hext-Hexc, as shown in FIGS. 3A and 3B. Here, since magnetic permeabilities of the soft magnetic film cores 12 and 13 are equal to each other, the magnetic flux densities thereof are the same as shown in FIGS. 3C and 3D. A voltage shown in FIG. 3F is induced to the magnetic flux variation detecting coil 15. Here, FIG. 3E shows induced voltages due to the respective magnetic flux densities of the soft magnetic film cores 12 and 13, which are combined to obtain a composite voltage shown in FIG. 3F. The magnitude of the external magnetic field Hext can be determined by measuring the magnitude of the composite voltage.

In the magnetic field sensing device using the semiconductor substrate 11, it is important to alternately wind turn by turn the excitation coil 14a–14b wound around the two soft magnetic film cores 12 and 13 in a "figure-8" shaped solenoidal and the magnetic flux variation detecting coil 15a–15b wound to obtain the sum of magnetic flux variations generated in the soft magnetic film cores 12 and 13. As described above, the excitation coil 14a–14b and the magnetic flux variation detecting coil 15a–15b are alternately wound on the semiconductor substrate 11, where the excitation coil 14a–14b is wound in a "figure-8" shape to be in opposite directions with respect to the soft magnetic film cores 12 and 13 and the magnetic flux variation detecting coil 15a–15b is wound spirally to be in the same direction with respect to the soft magnetic film cores 12 and 13. In such a manner, when there is not external magnetic field Hext applied, the waveforms of induced voltage are offset. In other words, the magnetic flux generated by the excitation current 14a–14b has a winding structure in which closed magnetic paths are formed by the lower soft magnetic film core 12 and the upper soft magnetic film core 13.

Unlike the above-described structure, if an excitation coil and a magnetic flux variation detecting coil are arranged in a single core, magnetic field detection is allowed. However, in this case, a burdensome signal processing such as amplification or filtering is required to eliminate outputs of the magnetic flux variation detecting coil because a large induced voltage is generated in the magnetic flux variation detecting coil due to the excitation coil even if there is no external magnetic field applied.

Figure 4:
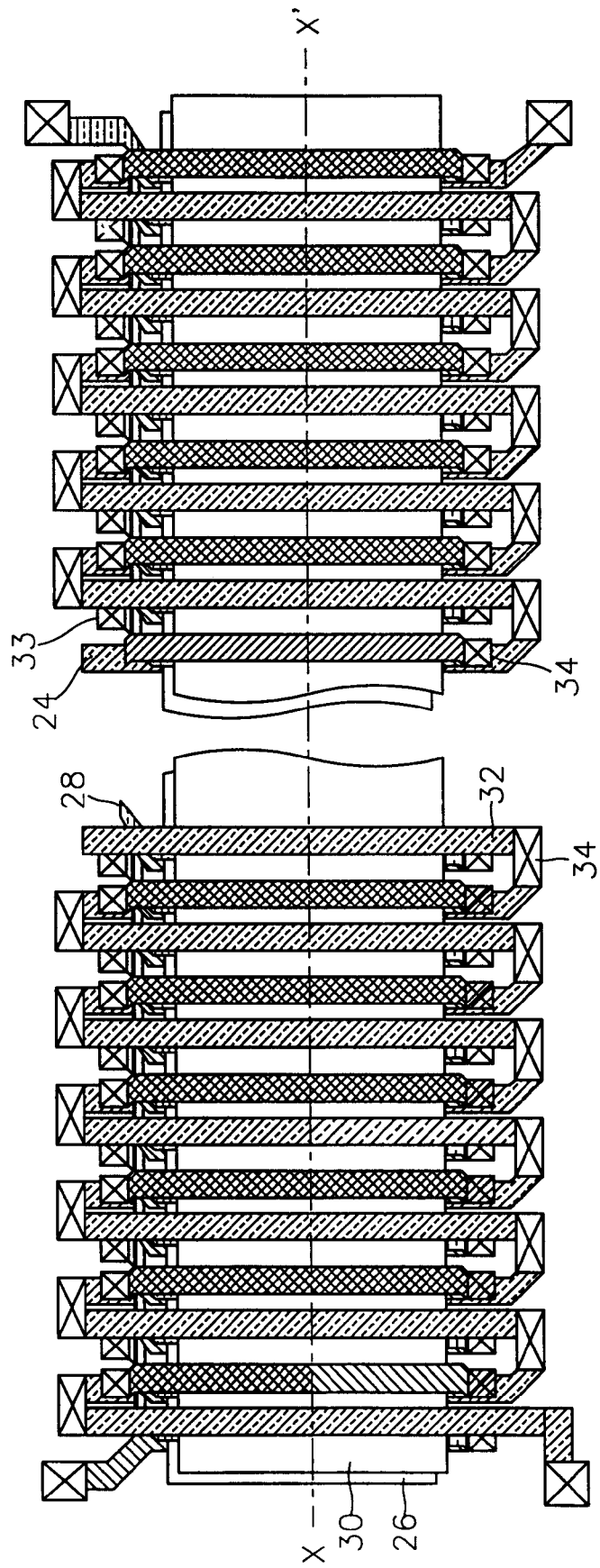
FIG. 4 is a plan view illustrating the differential solenoidal magnetic field sensing device shown in FIG. 2.
Figure 5:
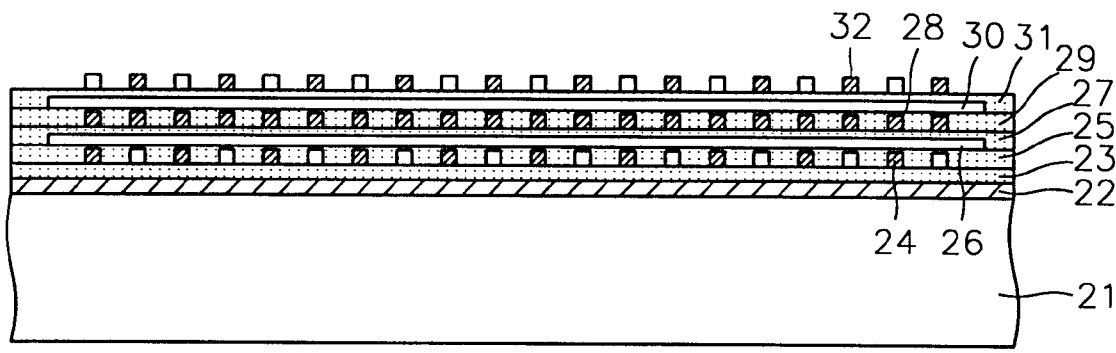
FIG. 5 is a cross-sectional view taken along the line X–X' of FIG. 4.

FIG. 4 is a plan view illustrating the differential solenoidal magnetic field sensing device shown in FIG. 2, and FIG. 5 is a cross-sectional view taken along the line X–X' of FIG. 4. As shown in FIGS. 4 and 5, insulation layers (polyimide, etc) 22 and 23 such as a silicon oxide layer are formed on a semiconductor substrate 21 and three-layered metal wires, that is, a bottom-layer wire 24, a middle-layer wire 28 and a top-layer wire 32 of a coil, are connected to one another with throughholes 33 and 34 interposed therebetween, thereby realizing a "figure-8" shaped excitation coil and a spirally wound magnetic flux variation detecting coil having the same winding structure as shown in FIG. 2 (14a–14b and 15a–15b of FIG. 2, respectively). That is according to an embodiment of the present invention, insulation layers (e.g., polyimide) 25, 27, 29 and 31 are inserted into the bottom-layer wire 24, the middle-layer wire 28 and the top-layer wire 32, and soft magnetic film cores 26 and 30 are interposed among the insulation layers 25, 27, 29 and 31.

In the case of using a semiconductor substrate as in this embodiment, it is important to alternately wind turn by turn the excitation coil and the magnetic flux variation detecting coil around the soft magnetic film cores 26 and 30. If not, since the soft magnetic film cores have a large leakage magnetic flux, the magnetic flux variation due to the excitation coil cannot be sufficiently picked up by the magnetic flux variation detecting coil. Also a "figure-8" shaped excitation coil and a magnetic flux variation detecting coil are alternately wound turn by turn on the semiconductor substrate and are differentially driven at the same time using two cores, thereby forming closed magnetic paths. Also, when there is no external magnetic field, induced voltages generated from the internal magnetic flux variation due to the excitation coil are offset.

Now, a method for manufacturing the aforementioned magnetic field sensing device according to an embodiment of the present invention will be described.

FIGS. 6A through 6F illustrate processing steps of a method for manufacturing the differential solenoidal magnetic field sensing device according to an embodiment shown in FIGS. 4 and 5. Here, a silicon substrate, for example, is used as the semiconductor substrate.

Figure 6A:
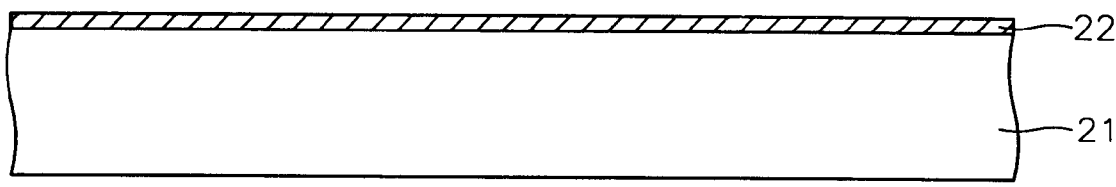
FIGS. 6A through 6F illustrate processing steps of a method for manufacturing the differential solenoidal magnetic field sensing device shown in FIG. 2.

First, as shown in FIG. 6A, the surface of a silicon substrate 21 is thermally oxidized for insulation of the same to form an insulation layer ($SiO_2$) 22.

Figure 6B:
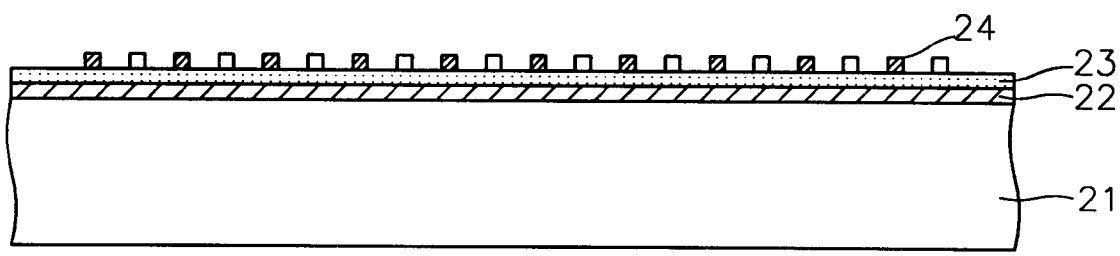

As shown in FIG. 6B, another insulation layer 23, e.g., silicon oxide, photoresist or polyimide, is formed on the $SiO_2$ insulation layer 22. A metal layer for a bottom-layer wire of a coil is formed on the insulation layer 23 and then etched using photolithography, thereby forming a metal pattern, that is, a bottom-layer wire 24. As the wire metal, Au, Cu or Al is used. To form the metal layer, various methods including a deposition method such as a sputtering method or a chemical vapor deposition (CVD) method may be employed. However, in the case of forming a thick Cu layer, it is effective to employ an electroplating method or a non-electrolytic plating method.

Figure 6C:
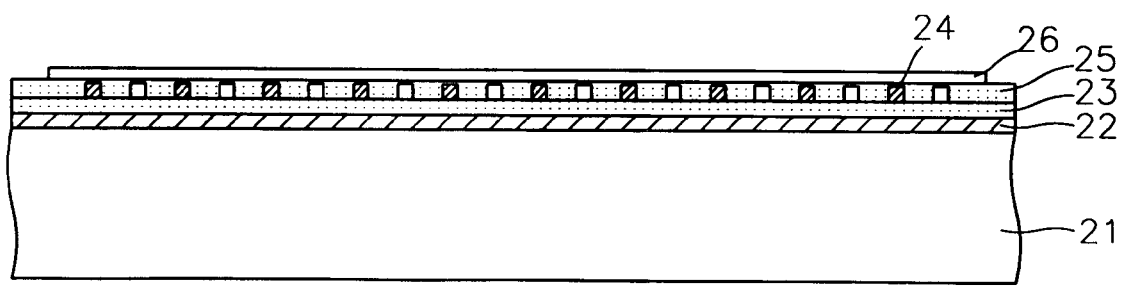

Next, as shown in FIG. 6C, silicon oxide, photoresist or polyimide is further deposited to cover the bottom-layer wire 24 on the insulation layer 23 having the bottom-layer wire 24, thereby forming an insulation layer 25. As the deposition method of the insulation layer 25, a sputtering method or a chemical vapor deposition (CVD) method may be employed using silicon oxide, photoresist or polyimide. The photoresist and the polyimide is cured to be used as an insulation layer. Here, a planarization process is performed on the bottom-layer wire to avoid surface roughness. Then, a soft magnetic material for forming a bottom magnetic film is deposited and patterned to form a soft magnetic film core 26. Soft magnetic material deposition methods include an electroplating method, a sputtering method, a deposition method and the like. Soft magnetic materials include a permalloy (an alloy of nickel (ni) and iron (Fe)) and various amorphous magnetic alloys. The soft magnetic materials and non-magnetic materials are laminated to form the multi-layered soft magnetic film core 26.

Figure 6D:
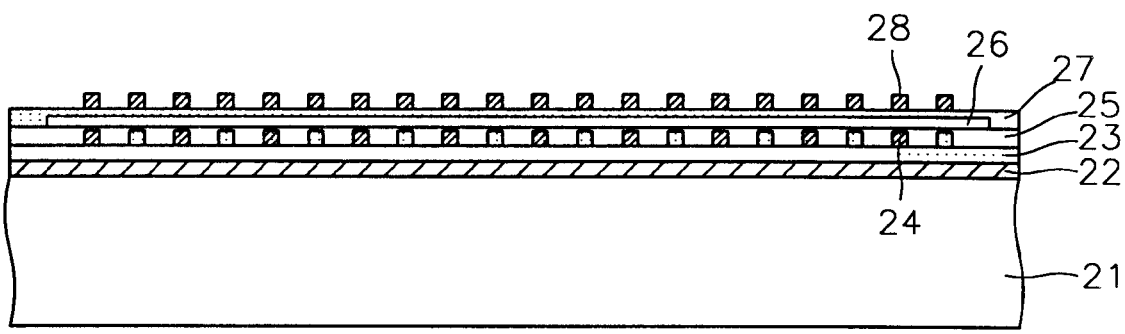

As shown in FIG. 6D, an insulation layer (polyimide, etc) 27 is deposited to cover the soft magnetic film core 26 and planarized to then etch the same using photolithography, thereby forming a throughhole (33 and 34 of FIG. 4). Then, a metal layer for a middle-layer wire is formed and patterned to form a middle-layer wire 28 of a coil.

Figure 6E:
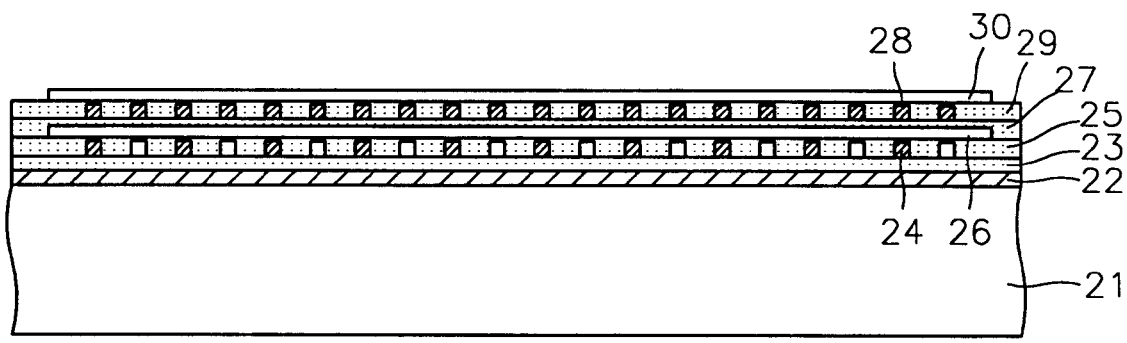

Then, as shown in FIG. 6E, an insulation layer (polyimide, etc) 29 is deposited to cover the middle-layer wire 28 and planarized. Thereafter, a soft magnetic material for forming a top magnetic film is deposited and patterned to form a soft magnetic film core 30.

Figure 6F:
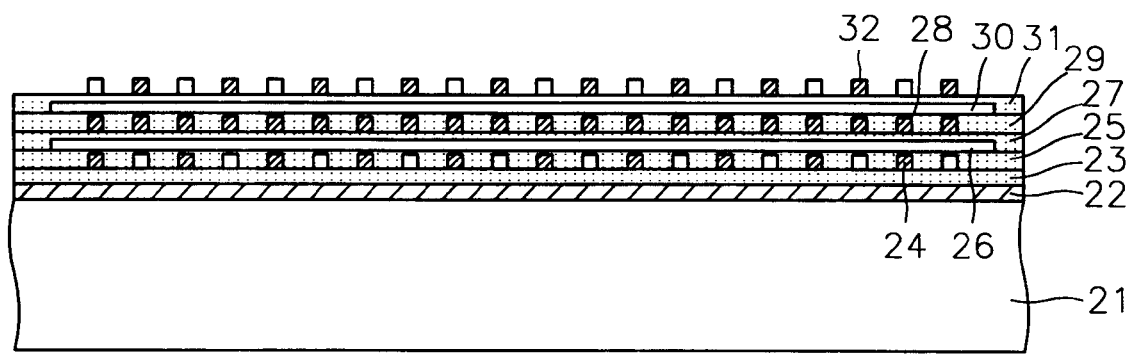

Next, as shown in FIG. 6F, an insulation layer (polyimide, etc.) 31 is deposited to cover the soft magnetic film core 30 and planarized to then etch the same using photolithography, thereby forming a throughhole (33 and 34 of FIG. 4). Then, a metal layer for a top-layer wire is formed and patterned to form a metal pattern, that is, a top-layer wire 32 of a coil.

As described above, according to the present invention, the differential solenoidal magnetic field sensing device is a magnetic field sensor fabricated on a microscopic scale, which is constructed by two soft magnetic film cores laminated on a semiconductor substrate, an excitation coil formed of a "figure-8" shaped metal film pattern for alternating excitation of the soft magnetic film cores, and a magnetic flux variation detecting coil formed of a spirally wound metal film pattern. Since two soft magnetic film cores constitute closed magnetic paths, the leakage of magnetic flux can be minimized. Also, since the magnetic sensing device according to the present invention is a differential type sensor, the combination of driving signals can be offset. Further, since in the magnetic field sensing device according to the present invention, signal processing can be easily performed, even if it is a microscopic-scale sensor, it has high-sensitivity characteristics. In other words, two soft magnetic film cores are laminated and are formed lengthwise in the direction of a detection axis to reduce anti-magnetic field components. Also, the magnetic field sensing device is constructed such that the excitation coil and the magnetic flux variation detecting coil are alternately wound turn by turn around the soft magnetic film cores. Also, when an external magnetic field is zero, the waveforms of induced voltages are not generated in the magnetic flux variation detecting coil. Thus, even if the magnetic field sensing device is sensor fabricated on a microscopic scale, it can detect an extremely weak magnetic field. Also, since a thin film forming technology is employed on a monolithic semiconductor substrate, a signal processing circuitry is also integrated on the same chip. That is to say, the magnetic field sensing device according to the present invention has excellent characteristics in view of productivity and manufacturing cost.

The above-described magnetic field sensing device can be widely applied to navigation systems for detecting a terrestrial magnetism, terrestrial magnetism variation monitors (for prediction of earthquakes), bio-magnetism detecting sensors, metal defect sensors and the like. Also, the magnetic field sensing device can be indirectly applied to magnetic encoders, non-contact potentiometers, current sensors, torque sensors, displacement sensors and the like.

What is claimed is:

1. A differential solenoidal magnetic field sensing device comprising:

a semiconductor substrate;

soft magnetic film cores stacked one on top of the other on the semiconductor substrate to be laminated to form closed magnetic paths parallel to each other;

a solenoidal excitation coil formed of a metal thin film for alternate excitation and differential excitation of the soft magnetic film cores, said solenoidal excitation coil being around both soft magnetic film cores individually in a "figure-8" pattern; and a solenoidal magnetic flux variation detecting coil made of a metal thin film for detection of magnetic flux variation in the soft magnetic film cores, said solenoidal magnetic flux variation detecting coil being around a combination of both soft magnetic film cores.

2. The differential solenoidal magnetic field sensing device according to claim 1, wherein the excitation coil is wound n turns where n is a positive integer, and the magnetic flux variation detecting coil is wound m turns where m is a positive integer, the excitation coil and the magnetic flux variation detecting coil being alternately wound turn by turn, and wherein when an external magnetic field is zero, the induced waveforms caused by the excitation coil are offset.

3. The differential solenoidal magnetic field sensing device according to claim 1, wherein the magnetic flux variation detecting coil is a solenoidal planar coil spirally wound around the combination of the soft magnetic film cores.

4. A method for manufacturing a differential solenoidal magnetic field sensing device comprising the steps of:

(a) forming an insulation layer on a semiconductor substrate;

(b) forming a bottom-layer wire of a coil on the insulation layer;

(c) forming an insulation layer on the bottom layer wire of step (b) to cover the bottom-layer wire;

(d) depositing a soft magnetic for a bottom magnetic film on the insulation layer formed in step (c) and patterning the same to form a lower soft magnetic film core;

(e) depositing an insulation layer to cover the lower soft magnetic film core and etching the same using photolithography to form first throughholes; (f) forming a metal layer for a middle-layer wire n the insulation layer formed in step (e) and patterning the same to form a middle-layer wire of the coil electrically connected to said bottom-layer wire of a coil through said first throughholes;

(g) depositing an insulation layer on the insulation layer formed in step (e) to cover the middle-layer wire, depositing a soft magnetic material for a bottom magnetic film thereon and patterning the same to form an upper soft magnetic film core above the lower magnetic core;

(h) depositing an insulation layer to cover the upper soft magnetic film core and etching the same using photolithography to form second throughholes; and (i) forming a metal layer for a top-layer wire on the insulation layer formed in step (h) and patterning the same to form a top-layer wire of the coil electrically connected to said middle layer wire of the coil through said second throughholes.

5. The method according to claim 4, further comprising the step of forming the semiconductor substrate from silicon.

6. The method according to claim 4, wherein the steps of forming bottom-layer wire, the middle-layer wire and the top-layer wire includes selecting at least one metal form the group consisting of aluminum (Al), gold (Au) and copper (Cu).

7. The method according to claim 6, wherein the steps of forming the bottom-layer wire, the middle-layer wire and the top-layer wire includes using a deposition method to deposit Al.

8. The method according to claim 7, wherein the deposition method is a sputtering method.

9. The method according to claim 7, wherein the deposition method is a chemical vapor deposition (CVD) method.

10. The method according to claim 9, wherein the steps of forming the bottom-layer wire, the middle-layer wire and the top-layer wire includes using a deposition method to deposit Au.

11. The method according to claim 10, wherein the deposition method is a sputtering method.

12. The method according to claim 10, wherein the deposition method is a chemical vapor deposition (CVD) method.

13. The method according to claim 6, wherein the steps of forming the bottom-layer wire, the middle-layer wire and the top-layer wire include using a electroplating method to deposit Cu.

14. The method according to claim 6, wherein the steps of forming the bottom-layer wire, the middle-layer wire and the top-layer wire includes using a non-electrolytic plating method to deposit Cu.

15. The method according to claim 4, wherein the steps of depositing the soft magnetic film cores includes forming multi-layer soft magnetic films prepared by laminating a Permalloy or amorphous magnetic alloy and a non-magnetic material.

16. The method according to claim 4, wherein the steps of insulation layer includes selecting at least material selected from the group consisting of silicon oxide, photoresist and polyimide.

* * * * *